United States Patent [19]
Kim

[11] Patent Number: 6,069,025
[45] Date of Patent: May 30, 2000

[54] METHOD FOR PACKAGING A SEMICONDUCTOR DEVICE

[75] Inventor: Jin Sung Kim, Chungeheongbuk-do, Rep. of Korea

[73] Assignee: LG Semicon Co., Ltd., Chungcheongbuk, Rep. of Korea

[21] Appl. No.: 08/558,305

[22] Filed: Nov. 15, 1995

[30] Foreign Application Priority Data

Nov. 15, 1994 [KR] Rep. of Korea .................. 94-29877

[51] Int. Cl.⁷ .................................................. H01L 23/24
[52] U.S. Cl. ..................... 438/109; 438/106; 438/108; 257/668; 257/686; 257/724; 257/777
[58] Field of Search ............................. 437/208, 217, 437/220, 915; 257/777, 676, 723, 668, 670, 672, 724; 438/108, 109, 126, 123, 110

[56] References Cited

U.S. PATENT DOCUMENTS

| | | | |
|---|---|---|---|
| 3,663,184 | 5/1972 | Wood et al. | 29/195 |
| 4,862,322 | 8/1989 | Bickford et al. | 361/386 |
| 4,933,219 | 6/1990 | Sakumoto et al. | 428/40 |
| 5,302,854 | 4/1994 | Nishiguchi et al. | 257/737 |
| 5,331,235 | 7/1994 | Chun | 257/777 |
| 5,346,118 | 9/1994 | Degani et al. | 427/254 |
| 5,407,864 | 4/1995 | Kim | 437/209 |
| 5,429,992 | 7/1995 | Abbott et al. | 438/123 |
| 5,438,224 | 8/1995 | Papageorge et al. | 257/787 |
| 5,471,369 | 11/1995 | Honda et al. | 257/787 |
| 5,491,612 | 2/1996 | Nicewarner, Jr. | 257/778 |
| 5,527,740 | 6/1996 | Golwalkar et al. | 437/220 |
| 5,530,292 | 6/1996 | Waki et al. | 257/777 |
| 5,567,654 | 10/1996 | Beilstein, Jr. et al. | 437/209 |
| 5,570,274 | 10/1996 | Saito et al. | 257/724 |
| 5,627,405 | 5/1997 | Chillara | 257/778 |
| 5,719,436 | 2/1998 | Kuhn | 257/676 |
| 5,796,164 | 8/1998 | McGraw et al. | 257/723 |

FOREIGN PATENT DOCUMENTS

| | | | |
|---|---|---|---|
| 60-95958 | 5/1985 | Japan | 257/777 |
| 2-156662 | 6/1990 | Japan | 257/777 |
| 5-152503 | 6/1993 | Japan . | |
| 5-251632 | 9/1993 | Japan . | |
| 6-21329 | 1/1994 | Japan | 257/777 |
| 6-216314 | 8/1994 | Japan . | |

*Primary Examiner*—Donald L. Monin, Jr.
*Assistant Examiner*—Michael Dietrich
*Attorney, Agent, or Firm*—Loudermilk & Associates

[57] ABSTRACT

Semiconductor packaged and methods for packaging semiconductor devices are provided. A method in accordance with the invention may include the steps of: attaching solder bumps on bonding pads of a wafer; cutting the wafer into individual chips, and attaching the chips to an interface board; coupling the interface board with a lead frame; and wire-bonding the bump pads of the interface board and the inner leads of the lead frame, and carrying out a molding process. The semiconductor package may include an interface board having an interface board substrate, a plurality of interface board bump pads, wires for connecting the interface board bump pads on upper and lower faces of the substrate, and wire bonding pads electrically connected to the interface board bump pads; an upper chip and a lower chip attached on the upper and lower portions of the interface board, and electrically connected through the solder bumps to the bonding pads of the chip; inner leads and outer leads connected through wires to the wire bonding pads of the interface board; and a molding compound.

8 Claims, 6 Drawing Sheets

METHOD FOR PACKAGING A SEMICONDUCTOR DEVICE

FIELD OF THE INVENTION

The present invention relates to semiconductor device packaging and methods for packaging semiconductor devices, and more particularly packaging in which two or more memory chips are packed into one plastic package so as to form a stacked-chip package, thus achieving ultra compactness.

BACKGROUND OF THE INVENTION

Generally, a semiconductor device is formed by fabricating a silicon wafer, and respective chips are packaged with epoxy or the like so as to be used as electronic parts. In accordance with the trend of miniaturizing electronic apparatuses, attempts are being made to achieve high density semiconductor devices. Therefore, the package itself is being more and more miniaturized, and attempts are being made to pack one or more chips into one package.

The stack chip package (SCP) is one such conventional package. As illustrated in FIG. 1, such a package uses a mirror type semiconductor chip having a different: pad layout structure which is formed by taking into account the desired electrical connections. The package has upper chip 11 and lower chip 12 arranged up and down, inner leads 13 connected to pads of the semiconductor chips, respectively, outer leads 14 connected to the inner leads, respectively, by laser-welding, and a molding compound such as epoxy.

In order to manufacture the package of such a structure, the wafer for which the fabrication has been completed is subjected to a sawing, and solder bumps are attached on bonding pads. By utilizing the solder bumps, the inner leads are connected to the bonding pads, and two such chips are disposed symmetrically above and below. The inner leads and the outer leads are laser-welded together, a molding is carried out, and the outer leads are trimmed and formed, thereby completing the package.

In this package, however, in order to form an electrical connection between the inner leads of the upper and lower chips and the outer leads, the layout of the upper and lower bonding pads of the upper chip and lower chip should take a mirror form. Therefore, two mutually different chip layouts are required, and the inner leads and the outer leads are laser-welded by placing them face to face with each other for each pair. Therefore, a highly difficult technique is required, and thus the productivity becomes low, while new equipment also is required. Further, a first step of trimming and forming the inner leads is carried out, and a second step of trimming and forming the outer leads is carried out. Therefore, the process is complicated, and the yield is low, while automation becomes difficult in view of the nature of the technique.

SUMMARY OF THE INVENTION

It is an object of the present invention to provide semiconductor packages and methods for packaging a semiconductor device which address the above-described disadvantages of the conventional technique.

In achieving this object, a method for packaging a semiconductor device is provided which may include the steps of:

attaching solder bumps on bonding pads of a wafer;

cutting the wafer into individual chips, and attaching the chips to an interface board;

coupling the interface board with a lead frame; and wire-bonding pads of the interface board and inner leads of the lead frame, and carrying out a molding process.

The step of attaching the solder bumps to the bonding pads of the wafer may be carried out in such a manner that solder is deposited on the wafer, or the wafer is dipped into melted solder.

The step of attaching the chips onto the interface board may be carried out in such a manner that the chips are exactly positioned on the interface board, and heat and pressure are applied so that the solder bumps attached to the bonding pads of the wafer are melted, which melt-bond onto corresponding bump pads of the interface board.

The step of coupling the lead frame with the interface board may be carried out in such a manner that two-sided adhesive tape is attached on a tie bar of the lead frame, and the lead frame and the interface board are coupled together.

In another aspect of the present invention, a semiconductor package according to the present invention may include:

an interface board including: an interface board substrate, a plurality of interface board bump pads, wires for connecting the interface board bump pads formed at a bottom side of the substrate to the interface board bump pads formed at an upper face of the substrate, and wire bonding pads of the interface board electrically connected to the interface board bump pads;

an upper chip and a lower chip attached on the upper and lower portions of the interface board, and electrically connected through the solder bumps of bonding pads of the chip and of bump pads of the interface board;

outer leads and inner leads connected through wires to the wire-bonding pads of the interface board; and a molding compound for covering the interface board, the upper chip, the lower chip and the inner leads.

The interface board may be formed in such a manner that the interface board bump pads of the upper face of the substrate and the interface board bump pads of the bottom of the substrate are disposed with a rotational symmetry relative to an axis of the interface board.

BRIEF DESCRIPTION OF THE DRAWINGS

The above and other objects and advantages of the present invention will become more apparent by describing in detail the preferred embodiments of the present invention with reference to the attached drawings in which.

DESCRIPTION OF THE PREFERRED EMBODIMENTS

Figure 1:
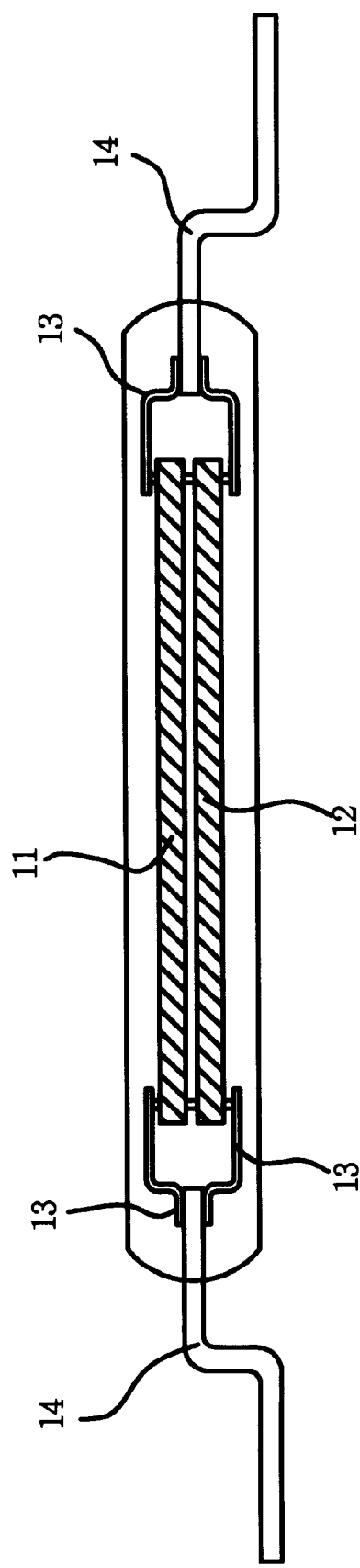
FIG. 1 is a sectional view illustrating a conventional semiconductor device.
Figure 2:
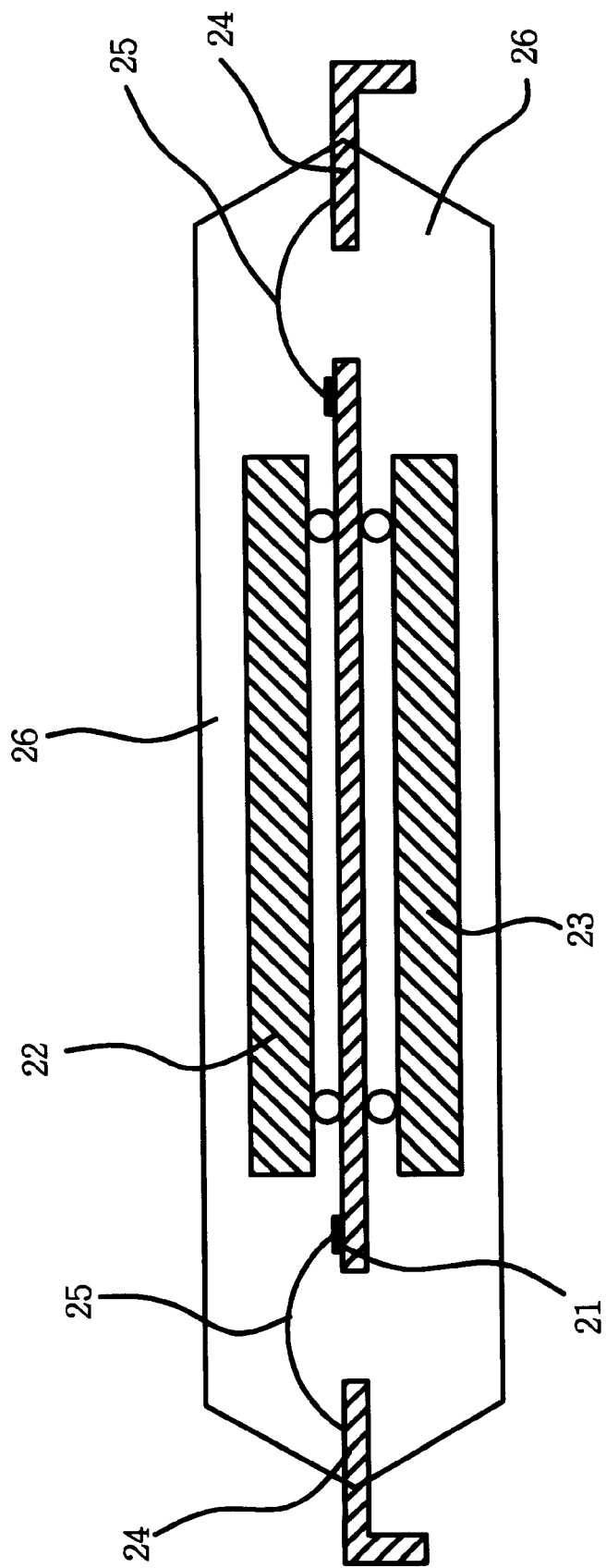
FIG. 2 is a sectional view illustrating a semiconductor device package according to the present invention.

FIG. 2 is a sectional view illustrating the constitution of a semiconductor device package according to a preferred embodiment of the present invention. The semiconductor device chip is constituted such that at the two sides of interface board 21, upper chip 22 and lower chip 23, which have bonding pads of the same layout, are provided. Bump pads of interface board 21 and bonding pads of the chips are electrically connected, respectively, through solder bumps. Wire-bonding pads of the interface board are electrically connected through wires 25 to inner leads 24, and a compound 26 such epoxy is molded up to the inner leads, thereby packaging the device.

Figure 3:
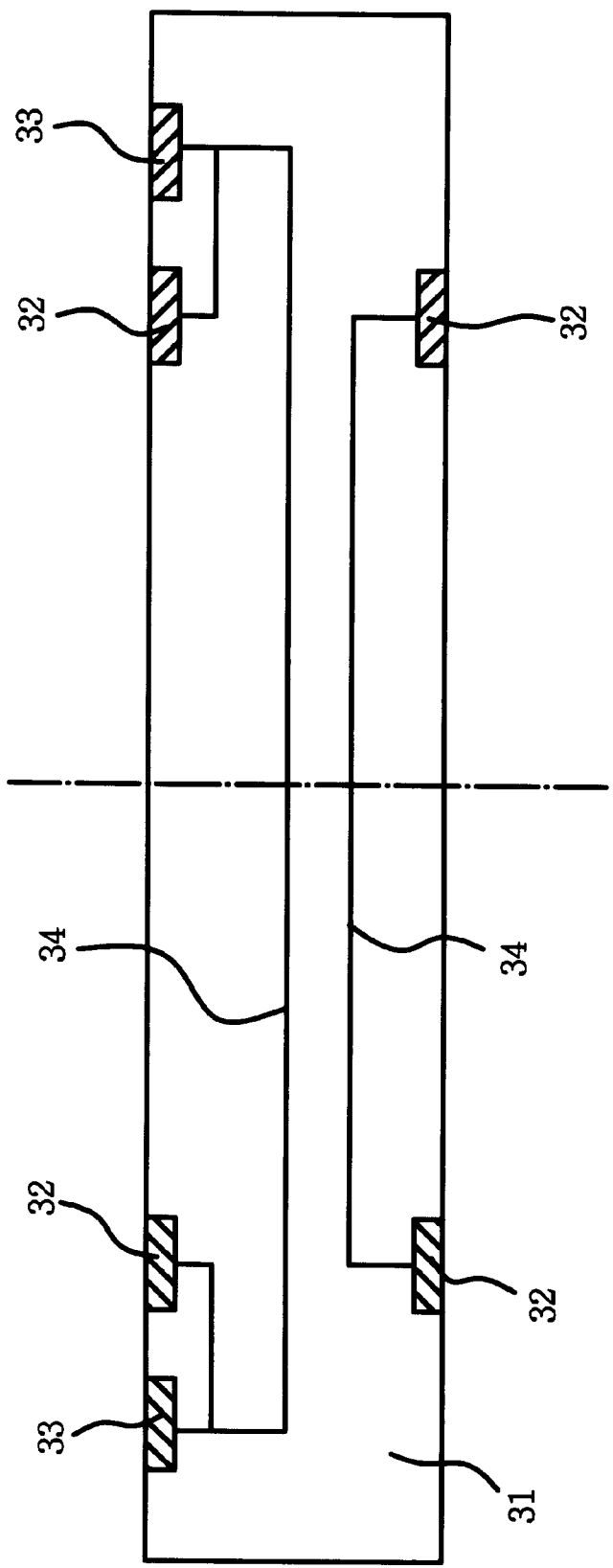
FIG. 3 is a sectional view illustrating an interface board according to the present invention.

As illustrated in FIG. 3, interface board 21 includes interface board bump pads 32, arranged like the pad layout of the semiconductor chips on the surface of insulating substrate 31 and wire bonding pads 33 connected through wires 34 to interface board bump pads 32. Among interface board bump pads 32, those which are formed above are arranged according to the bonding pad layout of upper chip 22, which is to be attached to the upper portion, while those which are formed on the lower portion of the interface board are arranged according to the bonding pad layout of lower chip 23, which is to be attached on the lower portion. Therefore, in the case where the upper and lower chips have the same layout, they are arranged with rotational symmetry relative to the axis, i.e., in a mirror form. On the other hand, if the upper and lower chips do not have the same bonding pad layout, then interface board bump pads 32 are arranged according to the respective layouts of the chips.

Interface board bump pads 32 are connected together with wires 34 taking into account the desired electrical connections within the interface board. They also are connected with wire bonding pads 33 of the interface board.

Figure 4:
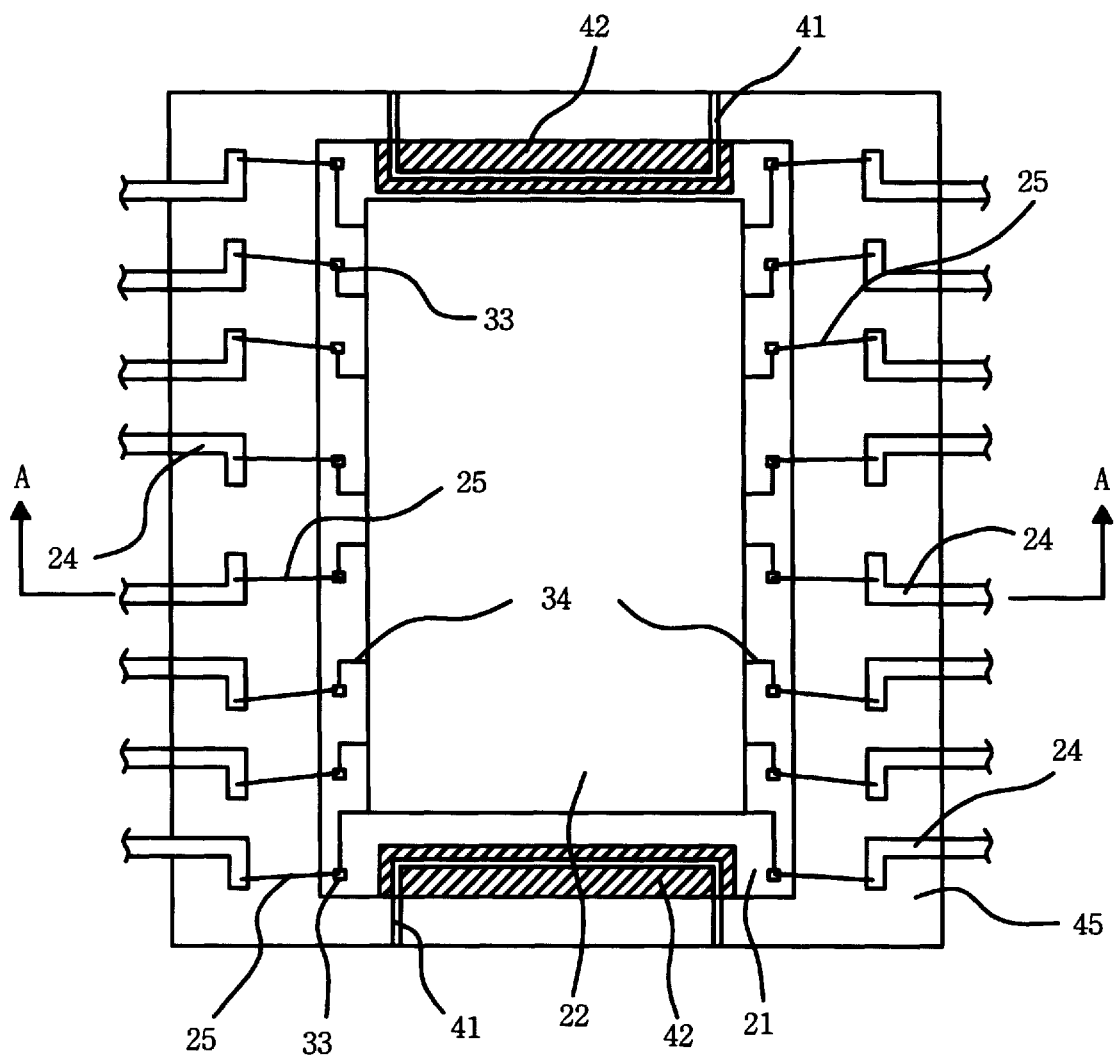
FIG. 4 is a plan view illustrating a semiconductor device package of the present invention with the upper molding compound removed.

FIG. 4 is a plan view illustrating an assembly of a semiconductor device package and an interface board before carrying out the molding.

As can be seen from the plan view, interface board 21 has an area slightly wider than that of chip 22. The area is wide enough so that wire bonding pads 33 of interface board 21 are not covered by chip 22, and so that wire bonding pads 33 of interface board 21 can be freely wire-bonded with inner leads 24. Wire bonding pads 33 of interface board 21 are connected with inner leads 24 of the lead frame.

The interface board, upper chip and lower chip are covered with a plastic compound by a molding process. The outer leads are subjected to trimming and forming processes. Reference code 41 indicates a tie bar, reference code 42 indicates a two-side adhesive tape, and reference code 45 indicates the area surrounded by the molding compound.

Figure 5:
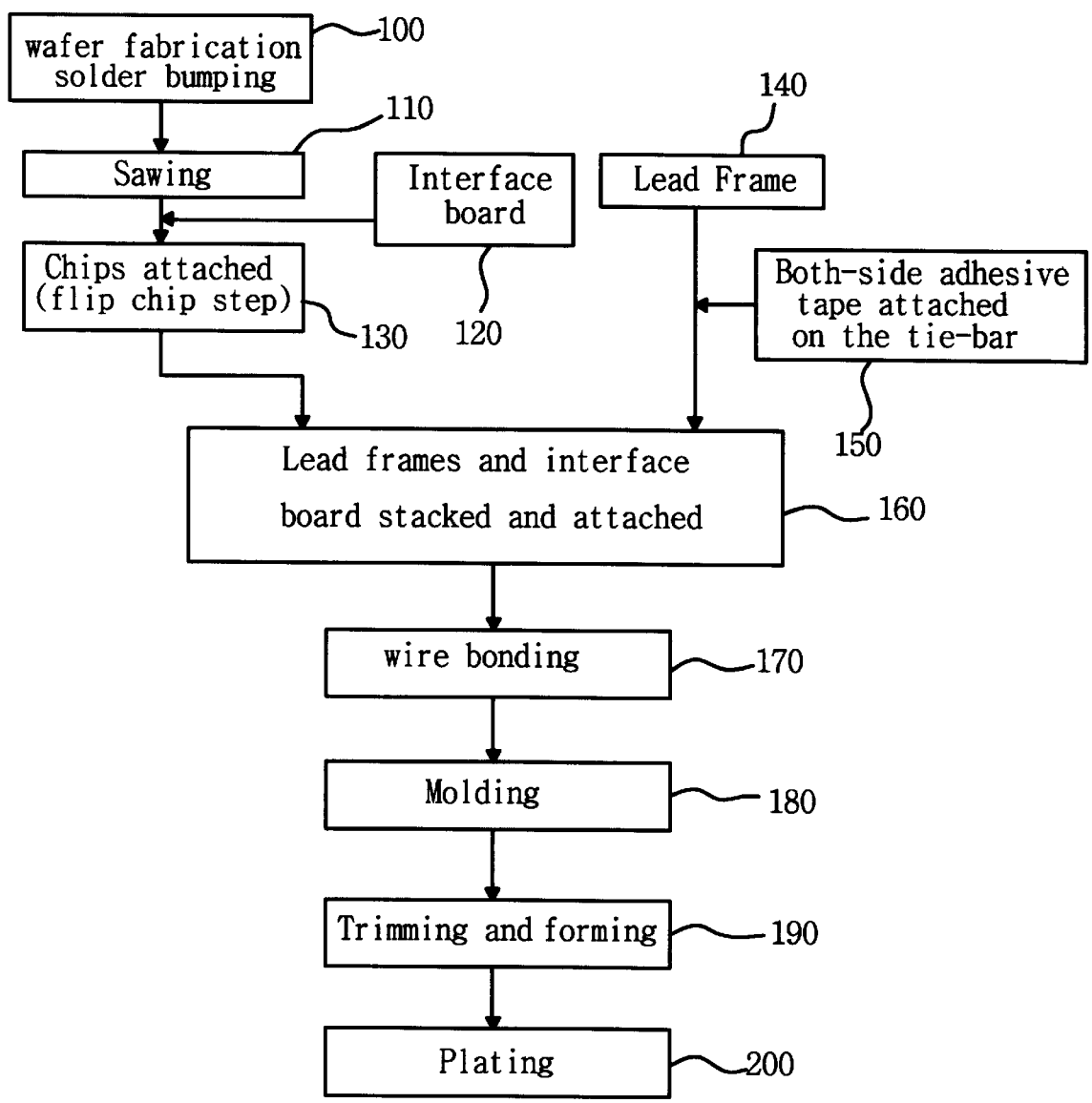
FIG. 5 is a flow chart illustrating a manufacturing method for a semiconductor device package according to the present invention.

FIG. 5 is a flow chart illustrating a process for packaging a semiconductor device according to the present invention. The process for packaging the semiconductor device is constituted as follows.

First, solder bumps are attached onto bonding pads of the wafer, which has undergone a wafer fabricating process (step 100). The solder bumps may be attached in such a manner that photo resist in the form of a liquid or a sheet is deposited, and a photo-etching is carried out on the chip pad portion. Solder is deposited or the wafer is dipped into melted solder, or an electroplating process is carried out.

Solder bumps are attached to the interface board bond pads (step 120). This step may be carried out in the following manner. Photo resist in the form of a liquid or sheet is deposited on the interface board, and the portions representing interface bump pads are photo-etched. A solder deposition process is carried out, or the board is dipped into melted solder, or an electroplating process is carried out, thereby forming solder bumps, or a mask is utilized to print the solder, and the solder bumps are formed based on a reflow process.

The wafer is cut/sawed into a plurality of chips (step 110). The chips are attached onto the interface board which has been prepared in advance (step 130). This step is carried out in the following manner. That is, the chips are positioned at exact positions on the interface board, and proper heat and pressure are applied so that the solder bumps attached on the bonding pads of the wafer melt, and the chips are fixed to bump pads 32 of the interface board. Further, in order to reinforce the adhesive strength, in preferred embodiments a gold film is formed to a thickness of about 20 micrometers between the chip pads and the solder bumps, and between the solder bumps and the interface bump pads. Then, the upper chip may be attached and the lower chip attached, or the upper and lower chips may be simultaneously attached to the interface board.

Tie bar 41 of the lead frame is positioned at the proper position on the interface board, and heat and pressure are applied to two-side adhesive tape 42 so that the lead frame and the interface board would be coupled together (step 160). Wire-bonding pads 33 of the interface board and inner leads 24 of the lead frame are connected together, which may use a conventional wire bonding method (step 170).

A molding process is carried out by a conventional method (step 180). The leads are trimmed and formed (step 190), and, if necessary, a plating process is carried out (step 200), thereby completing the manufacturing of the package.

Here, the interface board and the lead frame are prepared in advance (steps 120 and 140), and the two-side adhesive tape is attached to the lead frame in advance (step 150).

The interface board is of a multi-layer structure of two or more layers, and the electrical connections between the upper and lower semiconductor chips are formed in the manner of a printed circuit board or a ceramic substrate.

The electrical connections between the semiconductor chips and the interface board can be made by applying a flip chip bonding process, a flip chip bonding process with bumping on the interface board terminals, or the solder bumps being formed on the semiconductor chips.

Further, it is desirable that the thickness of the interface board is about 2 mm, and the concentration of the package is under about 90%.

The coupling between the interface board and the tie bar of the lead frame is formed in such a manner that a thermosetting or thermoplastic two-side adhesive such as polyimide film is stacked on the interface board or the tie bar of the lead frame, thereby fixedly securing them.

Figure 6:
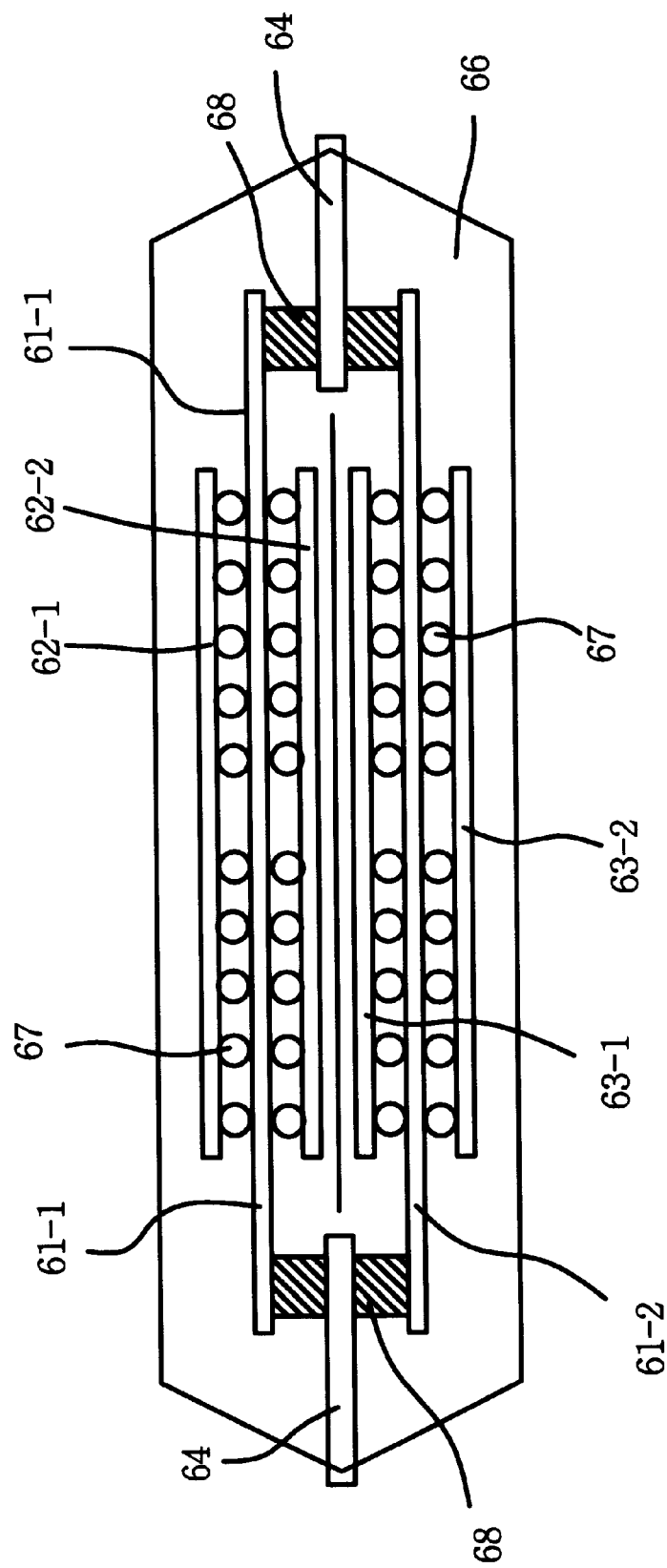
FIG. 6 is a sectional view illustrating another embodiment of a semiconductor device package according to the present invention.

FIG. 6 is a sectional view illustrating another embodiment of a semiconductor device package according to the present invention.

In this embodiment, a semiconductor package comprises first interface board 61-1, first upper chip 62-1 and first lower chip 62-2, which are disposed above and below first interface board 61-1, second interface board 61-2, second upper chip 63-1 and second lower chip 63-2, which are disposed above and below second interface board 61-2, a lead frame, and a molding compound.

First interface board 61-1 may be structured about the same as the interface board of the first embodiment. First upper chip 62-1 and first lower chip 62-2 may have the same bonding pad layout. First upper chip 62-1 and first lower chip 62-2 may be attached with an adhesive bump on the bonding pads, as semiconductor device chips having the same layout as that of the interface board. The pads of the chips and bump pads of the interface board are electrically connected respectively through bumps 67. Wire-bonding pads of first interface board 61-1 and second interface board 61-2 are electrically connected to inner leads 64 of the lead frame, which in a preferred embodiment is accomplished by way of anisotropic conductive films 68 ("ACFs"). In other embodiments, other conductive elements such as bonding wires are coupled between the interface boards and the inner leads of the lead frame.

Second interface board 61-2 is disposed on a lower layer, and second upper chip 63-1 and second lower chip 63-2 are disposed above and below second interface board 61-2, while second upper chip 63-1 and second lower chip 63-2 are attached with adhesive bumps on the bonding pads. Further, the pads of the chips 63-1 and 63-2 and the bump pads of second interface board 61-2 are electrically connected respectively through bumps 67. Wire bonding pads of second interface board 61-2 are electrically connected to inner leads 64 of the lead frame, which in a preferred embodiment is accomplished by way of anisotropic conductive films 68. In other embodiments, other conductive elements such as bonding wires are coupled between the interface boards and the inner leads of the lead frame.

In this semiconductor device package four chips can be stacked and connected. Such a structure can be used for many chips to be packaged in one package.

Particularly in the interface boards of the present invention, capacitors, load resistors or other circuit components can be mounted for performing special functions within the power line, or other circuitry. For example, to protect circuitry in a chip from an impulse or noise in a power line, a capacitor and load resistors (such as in an RC-type filter, etc.) can be inserted within the power line.

The present invention as explained above may provide the following effects.

(1) Freedom of the electrical connections can be improved by utilizing the interface board. Therefore, with the same layout, a stacked chip package of a two-chip stack structure or four-chip stack structure can be realized.

(2) Capacitors and load resistors can be installed within the power line of the interface board, and, therefore, the noise of the power line may be reduced. Further, in the case of a multi-layer structure of more than two layers, the freedom of the circuit connection may be improved.

(3) The interface board assembly and the tie bar of the lead frame are stacked using a film with a two-side adhesive spread thereon, and, therefore, process automation becomes possible due to the simplification of the process, so that a significant saving of the manufacturing cost may be possible.

(4) The flip chip bonding between the interface board and the semiconductor chips is a bonding process in which bonding is carried out on a PCB, and, therefore, the bonding becomes easy, so that a mass production may be possible.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for packaging a semiconductor device, comprising the steps of:

attaching solder bumps on bonding pads of a wafer, wherein the step of attaching solder bumps on bonding pads of the wafer comprises defining a solder bump forming portion by applying a photo process, and forming solder in the solder bump forming portion;

cutting the wafer into at least first and second chips, and attaching the at least first and second chips to an interface board using the solder bumps, wherein, before attaching the at least first and second chips to the interface board, the interface board is prepared by steps wherein a solder bump defining portion is defined and solder is formed in the solder bump defining portion, wherein the interface board includes bump pads to attach the at least first and second chips to the interface board, wherein the interface board comprises a multi-layer structure and has first and second faces, wherein the first face has a first set of bump pads including bump pads for the first chip and the second face has a second set of bump pads including bump pads for the second chip, wherein at least certain of the bump pads of the first set of bump pads are selectively connected electrically to at least certain of the bump pads of the second set of bump pads using electrical wiring selectively formed within the interface board and on the first and/or second faces;

coupling the interface board with a lead frame, wherein the lead frame includes inner leads, wherein the step of coupling the lead frame with the interface board is carried out in such a manner that a two-side adhesive tape is attached on a tie bar of the lead frame, and the lead frame and the interface board are coupled together;

wire-bonding bump pads of the interface board with inner leads of the lead frame with conductive wires; and carrying out a molding process.

2. The method of claim 1, wherein the step of attaching solder bumps on bonding pads of the wafer comprises depositing solder on the wafer after defining the solder bump forming portion.

3. The method of claim 1, wherein the step of attaching solder bumps to bonding pads of the wafer comprises dipping the wafer into melted solder after defining the solder bump forming portion.

4. The method of claim 1, wherein the interface board is prepared by steps wherein the solder bump defining portion is defined by a photo process, and solder is deposited to form solder bumps on the bump pads of the interface board.

5. The method of claim 1, wherein the interface board is prepared by steps wherein the solder bump defining portion is defined by a photo process, and solder is electroplated to form solder bumps on the bump pads of the interface board.

6. The method of claim 1, wherein the interface board is prepared by steps wherein the solder bump defining portion is defined by a photo process, and the interface board is dipped into melted solder to form solder bumps on the bump pads of the interface board.

7. The method of claim 1, wherein the interface board is prepared using a solder mask to print solder on the interface board, followed by a solder reflow process to form solder bumps on the bump pads of the interface board.

8. The method of claim 1, wherein the step of attaching the chips to the interface board is carried out in such a manner that the chips are positioned on the interface board, and heat and pressure are applied, wherein the solder bumps attached on the bonding pads of the wafer are melted so as to melt-bond onto the bump pads of the interface board.

* * * * *